(12) United States Patent
Huck

(10) Patent No.: US 11,722,118 B2
(45) Date of Patent: Aug. 8, 2023

(54) SAW RESONATOR WITH IMPROVED POWER DURABILITY AND HEAT RESISTANCE AND RF FILTER COMPRISING AN SAW RESONATOR

(71) Applicant: RF360 EUROPE GMBH, Munich (DE)

(72) Inventor: Christian Huck, Munich (DE)

(73) Assignee: RF360 SINGAPORE PTE. LTD., San Diego, CA (US)

(*) Notice: Subject to any disclaimer, the term of this patent is extended or adjusted under 35 U.S.C. 154(b) by 155 days.

(21) Appl. No.: 17/046,699

(22) PCT Filed: Mar. 8, 2019

(86) PCT No.: PCT/EP2019/055859
§ 371 (c)(1),
(2) Date: Oct. 9, 2020

(87) PCT Pub. No.: WO2019/197087
PCT Pub. Date: Oct. 17, 2019

(65) Prior Publication Data
US 2021/0083646 A1     Mar. 18, 2021

(30) Foreign Application Priority Data
Apr. 11, 2018 (DE) .......................... 102018108605.9

(51) Int. Cl.
*H03H 9/02*     (2006.01)
*H03H 9/145*     (2006.01)
*H03H 9/64*     (2006.01)

(52) U.S. Cl.
CPC .... *H03H 9/02834* (2013.01); *H03H 9/02543* (2013.01); *H03H 9/145* (2013.01); *H03H 9/64* (2013.01)

(58) Field of Classification Search
CPC .......... H03H 9/02834; H03H 9/02543; H03H 9/145; H03H 9/64; H03H 9/542;
(Continued)

(56) References Cited

U.S. PATENT DOCUMENTS

| 2017/0222622 | A1* | 8/2017 | Solal | H03H 9/02551 |
| 2017/0346463 | A1* | 11/2017 | Hatakeyama | H03H 9/02086 |
| 2018/0034440 | A1* | 2/2018 | Ruby | H03H 9/02866 |

FOREIGN PATENT DOCUMENTS

| JP | 3367903 B2 | 1/2003 |
| JP | 2005278121 A | 10/2005 |

OTHER PUBLICATIONS

B. Imbert et al., "Thin film quartz layer reported on silicon," 2011 Joint Conference of the IEEE International Frequency Control and the European Frequency and Time Forum (FCS) Proceedings, San Francisco, CA, USA, 2011, pp. 1-4.
(Continued)

*Primary Examiner* — Rakesh B Patel
*Assistant Examiner* — Jorge L Salazar, Jr.
(74) *Attorney, Agent, or Firm* — Patterson + Sheridan LLP

(57) ABSTRACT

An improved SAW (SAWR) resonator having an improved power durability and heat resistance and a protection to prevent device failure is provided. The SAW resonator has a carrier substrate (S) and an electrode structure (ES, EF) on a piezoelectric material (PM, PL). Further, the resonator has a shunt path (PCPP) parallel to the electrode structure and provided to enable an RF signal to bypass the electrode structure. The shunt path has a temperature dependent conductance with negative temperature coefficient of resistance.

20 Claims, 5 Drawing Sheets

Figure 1:
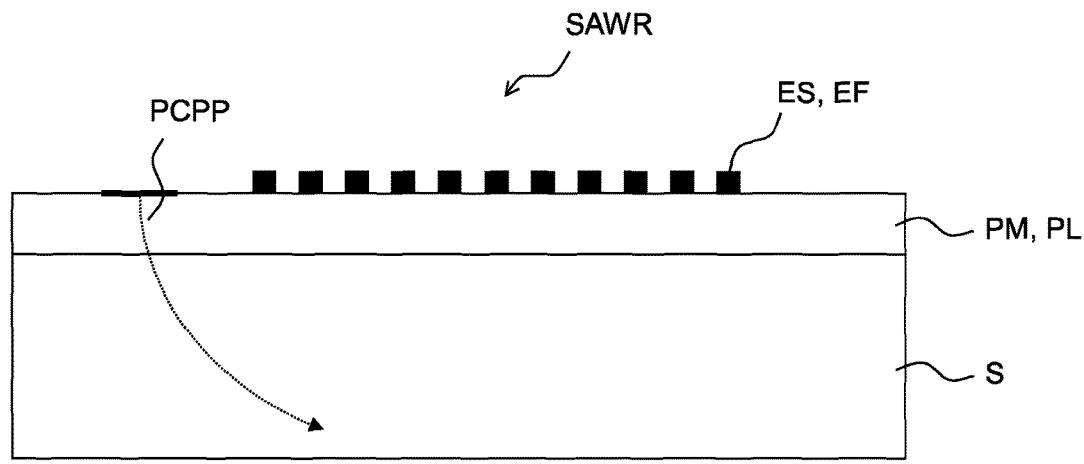

(58) Field of Classification Search
CPC ........... H03H 9/02921; H03H 9/02929; H03H 9/02574; H03H 9/02559
USPC .......................................... 333/133, 193–196
See application file for complete search history.

(56) References Cited

OTHER PUBLICATIONS

International Search Report and Written Opinion dated Jun. 25, 2019, corresponding Application No. PCT/EP2019/055859.
S. Matsuda et al., "Use of fluorine-doped silicon oxide for temperature compensation of radio frequency surface acoustic wave devices," in IEEE Transactions on Ultrasonics, Ferroelectrics, and Frequency Control, vol. 59, No. 1, pp. 135-138, Jan. 2012.
X. Tian et al., "Surface Acoustic Wave Devices Based on High Quality Temperature-Compensated Substrates," in IEEE Electron Device Letters, vol. 37, No. 8, pp. 1063-1066, Aug. 2016.
P. Wu et al., "Temperature Compensation of SAW in Zno/SiO2," in IEEE Ultrasonics Symposium, pp. 211-214, 2001.
Xiao et al., "Investigation of incredible high performance surface acoustic wave properties with a structure of IDT/?0YX-LiTaO3/SiO2/AlN/Silicon," 2017 Symposium on Piezoelectricity, Acoustic Waves, and Device Applications (SPAWDA), Chengdu, 2017, pp. 197-201.

\* cited by examiner

SAW RESONATOR WITH IMPROVED POWER DURABILITY AND HEAT RESISTANCE AND RF FILTER COMPRISING AN SAW RESONATOR

CROSS-REFERENCE TO RELATED APPLICATIONS

This application is a national stage application under 35 U.S.C. 371 of PCT/EP2019/055859, filed Mar. 8, 2019, which claims the benefit of German Application No. 102018108605.9, filed Apr. 11, 2018, both of which are incorporated herein by reference in their entireties.

The present invention refers to SAW resonators (SAW=surface acoustic wave) that have an improved power durability and an improved heat resistance and that protect a corresponding device against failure. Further, the present invention refers to RF filters comprising at least one such resonator.

In mobile communication systems RF filters are needed to distinguish between wanted RF signals and unwanted RF signals. RF filters can be utilized in frontend systems of mobile communication devices. For example, a transmission filter between a power amplifier and an antenna port is used to let only transmission signals propagate to an antenna port. In a reception signal path a reception signal is utilized to pass reception signals and in particular to isolate the reception port for transmission signals.

RF filters, such as RF filters working with acoustic waves, comprise electroacoustic resonators. In particular, SAW resonators working with surface acoustic waves comprise electrode structures arranged on a piezoelectric material. The electrode structures comprise interdigitated electrodes with electrode fingers connected to a busbar. Resonators of RF filters are exposed to RF power. Ohmic losses in the electrodes or other energy dissipation effects lead to an energy conversion from RF energy to heat. Correspondingly, heated resonators suffer a shift of characteristic frequencies such as resonance frequency or anti-resonance frequency due to expansion of the piezoelectric layer and a change of material properties, e.g. elastic stiffness with elevated temperature. Further, if the resonator is, for example, part of a bandpass filter configuration then the passband is shifted in frequency and the corresponding self-heating of the resonator gives rise to additional losses. If the temperature increase exceeds a certain critical value then it is possible for permanent damage to occur, resulting in a permanent failure of corresponding filter components.

Changes in temperature are problematic for electroacoustic filters because shifts in temperature cause shifts of characteristic frequencies such as center frequencies of bandpass filters. Further, an increase in temperature usually causes an increased insertion loss resulting in a reduced power efficiency.

Electroacoustic resonator structures are sensitive with respect to increased temperatures because their stacked construction may be jeopardized, e.g. by acoustomigration of atoms.

Especially the trend towards miniaturization results in an increased number of functionalities in a reduced volume leading to an increase in power density. An increased power density usually causes an increase of power dissipation density further jeopardizing the miniaturized electroacoustic structures.

Thus, what is needed is an SAW resonator with an improved power durability and an improved heat resistance and which is protected against failure and which complies with specifications concerning temperature-induced frequency drifts.

To that end, an SAW resonator and an RF filter comprising an SAW resonator according to the independent claims are provided. Dependent claims provide preferred embodiments.

The SAW resonator comprises a carrier substrate, an electrode structure and a piezoelectric material arranged between the carrier substrate and the electrode structure. Further, the resonator comprises a shunt path parallel to the electrode structure provided to enable an RF signal to bypass the electrode structure. The shunt path has a temperature dependent (electrical) conductance. In such a resonator the electrode structure can establish the interdigitated electrodes comprising electrode fingers arranged on the piezoelectric material and connected to a busbar. In particular, electrode fingers belonging to opposite polarizations are correspondingly connected to opposite busbars.

The carrier substrate acts as a carrier to support the corresponding functional structures arranged above the substrate. The piezoelectric material provides a piezoelectric axis that in combination with the orientation of the electrode structure—due to the piezoelectric effect—converts between RF signals and acoustic waves if RF signals are applied to the electrode structure.

The temperature dependency of the shunt path conductance provides a proper functioning of the resonator at normal operating parameters. It is preferred that the conductance of the shunt path increases with increasing temperature. Thus, at high temperatures, e.g. at temperatures exceeding a critical temperature, the conductance of the shunt path is sufficiently high to bypass RF power to protect the sensitive functional structures of the resonator.

Such an SAW resonator—due to the shunt path with a temperature dependent conductance—has an improved power durability and an improved heat resistance and has an intrinsic protection against failure. Thus, such a resonator can protect a corresponding RF filter or an RF filter component against temperature-induced failures.

If such a resonator is part of an RF filter of a mobile communication system it is possible that at excessively high temperatures phone calls or data transmissions are dropped temporarily and that the corresponding battery is drained faster. However, a permanent failure is prevented after normal operating temperatures have been reached and normal functionality is restored without permanent damage to the corresponding device.

Thus, an electrically conductive path is introduced to act temporarily as a shunt path. Self-heating and destruction due to energy dissipation within the sensitive structures, e.g. due to ohmic and acoustic losses, are reduced and irreversible damage is prevented resulting in an intrinsic self-protection. The conductivity of the shunt path can be tailored in such a way that a specified protection performance is given within a specified power and temperature range.

It is possible that the SAW resonator further comprises reflection structures. The resonator's electrode structure can be arranged between the reflection structures.

The reflection structures help confining acoustic energy in the resonator. The reflection structures prevent acoustic energy from leaving the resonator's acoustic track in longitudinal direction. Further, it is possible that the reflection structures are arranged in the vicinity of the electrode structure and connected to a ground potential. Thus, it is possible that the grounded reflection structures establish—at least partially—the shunt path.

It is possible that the piezoelectric material is contained in a piezoelectric layer and that the SAW resonator is a TF-SAW resonator (TF-SAW=thin film-surface acoustic wave).

TF-SAW resonators are characterized in that the piezoelectric material is not provided as a bulk material, e.g. as in the case of a conventional SAW resonator, but in that the piezoelectric material is provided as a thin film. A thin film material is characterized in that it is provided utilizing wafer bonding or thin film material deposition techniques, e.g. sputtering, physical vapor deposition, chemical vapor deposition, molecular beam epitaxy and the like.

TF-SAW resonators provide the specialty that the corresponding shunt path can be introduced with simple constructive means, as further explained below.

It is possible that the SAW resonator comprises a protection element. The protection element has temperature-dependent conductance and establishes an element of the shunt path.

The protection element can be an individual circuit element dedicated to provide the specific temperature dependence of the conductance.

However, it is also possible that the protection element is realized by different structures of the SAW resonator that are prepared to provide the temperature dependency of the conductance.

Correspondingly, it is possible that the SAW resonator has a stacked layer configuration. Electrode structures, contact structures and further conducting structures establishing parts of signal lines are arranged on the piezoelectric material. The conventional path for RF power of a resonator is to enter the resonator at an input electrode, to pass the resonator's functional structure and to leave the resonator at an output electrode. The main functional structures are the electrode fingers arranged on the piezoelectric material.

In conventional SAW resonators the materials below the electrode structures were designed to have a high resistivity in order to improve the resonator's insertion loss, in particular within a passband. In contrast thereto, the shunt path can lead at least partially to structures or layers below the electrode structure which is counterintuitive in view of the usual way to design SAW resonators.

It is possible that the carrier substrate comprises silicon.

Silicon is a material well-known from the field of semiconductor devices and can be provided with a high purity and good crystalline end surface quality.

It is possible that the SAW resonator comprises a shunt layer between the carrier substrate and the piezoelectric material.

In particular the shunt layer can have a temperature dependence of its conductance such that the shunt path of the SAW resonator at least partially leads through the shunt layer below the electrode structure.

It is possible that the shunt layer comprises polycrystalline silicon.

It is possible that the shunt layer has a conductivity below $10^{-3}$ $1/\Omega$ cm at temperatures below 100° C. and a conductivity above $10^{-3}$ $1/\Omega$ cm at temperatures above 200° C.

It is possible that the temperature dependence of the shunt path's conductance is obtained by doping.

It is possible that within the shunt layer, or at an interface of the shunt layer a two-dimensional electron gas is forming a layer with parasitic surface conduction (PSC) which provides the preferred temperature dependence of the conductance. The charge carrier's properties can be selected by means of doping or selecting an appropriate material with a suitable crystal structure.

It is possible that the SAW resonator comprises a compensation layer between the carrier substrate and the piezoelectric material.

The compensation layer can be a temperature compensation layer to compensate temperature-induced drifts of characteristic frequencies.

If the temperature of a conventional SAW resonator changes, then material properties such as the material's stiffness parameters and the material's densities are modified such that dimensions and wave velocities are negatively influenced. This results in a frequency drift of characteristic frequencies such as passband center frequencies or the frequency position of passband flanks.

To counteract these negative temperature-induced changes, the compensation layer is provided which has intrinsic temperature dependencies of characteristic properties such that a temperature compensation can be obtained and a total drift of characteristic frequencies can be reduced or even eliminated.

It is possible that the compensation layer comprises a material selected from a silicon oxide, a doped silicon oxide, silicon dioxide, doped silicon dioxide, fluorine-doped silicon dioxide.

The compensation layer can have a thickness between $0.01\lambda$ and $1\lambda$ wherein $\lambda$ is the wavelength of the acoustic main mode of the resonator.

The shunt layer can have a thickness of between $0.01\lambda$ and $1\lambda$.

It is possible that the SAW resonator comprises a shunt layer between the carrier substrate and the piezoelectric material while the piezoelectric material is in a piezoelectric layer. Thus, the resonator is a TF-SAW resonator. Further, the resonator has a compensation layer between the shunt layer and the piezoelectric layer. The carrier substrate comprises silicon or consists of silicon. The shunt layer comprises polycrystalline silicon and has a thickness between $0.01\lambda$ and $1.0\lambda$. The compensation comprises a silicon oxide and has a thickness between $0.01\lambda$ and $1.0\lambda$. The piezoelectric layer comprises lithium tantalate and has a thickness between $0.01\lambda$ and $1.0\lambda$. The electrode structure comprises aluminium as its main constituent and has a thickness between $0.02\lambda$ and $0.2\lambda$. Here, $\lambda$ is the acoustic wavelength of the resonator's main mode.

Other materials than lithium tantalate are also possible. Thus, it is possible that the piezoelectric material comprises or consists of lithium niobate or quartz or similar materials.

It is possible that the carrier substrate, e.g. comprising silicon, is oriented such that Euler angles are (0°±10°, 0°±10°, 45°±10°) or (45°±10°, 54°±10°, 0°±10°) with respect to the acoustic propagation direction of the resonator's main mode.

In this case, the Euler angles ($\lambda$, $\mu$, $\theta$) are defined as follows: a set of axes x, y, z, which are the crystallographic axes of the substrate, are firstly taken as a basis.

The first angle, $\lambda$, specifies the amount by which the x-axis and the y-axis are rotated about the z-axis, the x-axis being rotated in the direction of the y-axis. A new set of axes x', y', z' accordingly arises, where z=z'.

In a further rotation, the z'-axis and the y'-axis are rotated about the x'-axis by the angle $\mu$. In this case, the y'-axis is rotated in the direction of the z'-axis. A new set of axes x", y", z" accordingly arises, where x'=x". In a third rotation, the x"-axis and the y"-axis are rotated about the z"-axis by the angle $\theta$. In this case, the x"-axis is rotated in the direction of the y"-axis. A third set of axes x''', y''', z''' thus arises, where z"=z'''.

In this case, the x'''-axis and the y'''-axis are parallel to the surface of the substrate. The z'''-axis is the normal to the surface of the substrate. The x'''-axis specifies the propagation direction of the acoustic waves.

The definition is in accordance with the international standard IEC 62276, 2005-05, Annex A1.

It is possible that an RF filter comprises one or more SAW resonators as described above.

The RF filter can have a ladder-type like configuration with one or more series resonators electrically connected in series in a signal path and one or more parallel resonators in a corresponding number of shunt paths electrically connecting the signal path to ground.

Within the RF filter a single SAW resonator can be protected against temperature-induced failure. However, it is possible that two or more or all resonators are shunted via the shunt path.

Central aspects of the SAW resonator or of the RF filter and details of preferred embodiments are shown in the accompanying schematic figures.

Figure 2:
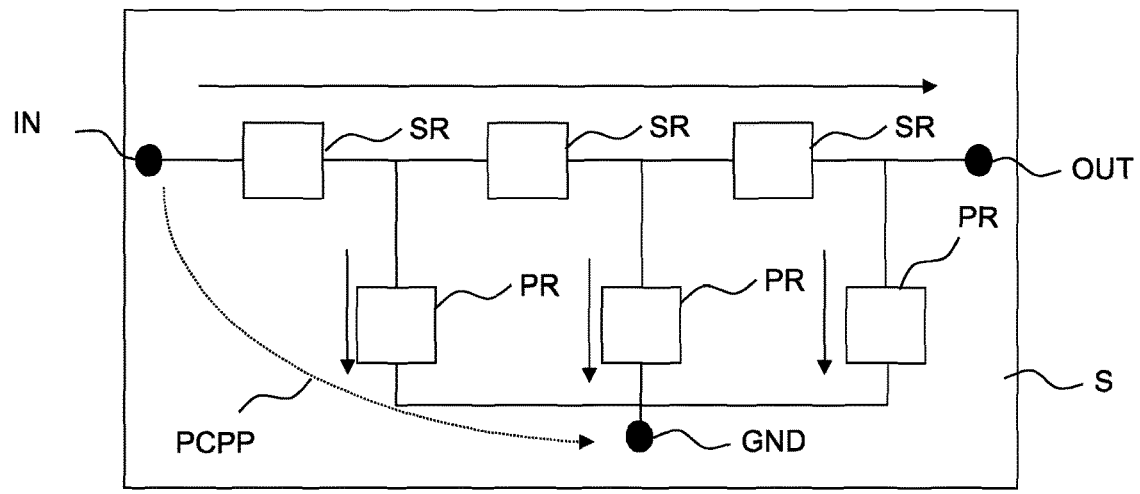
Figure 3:
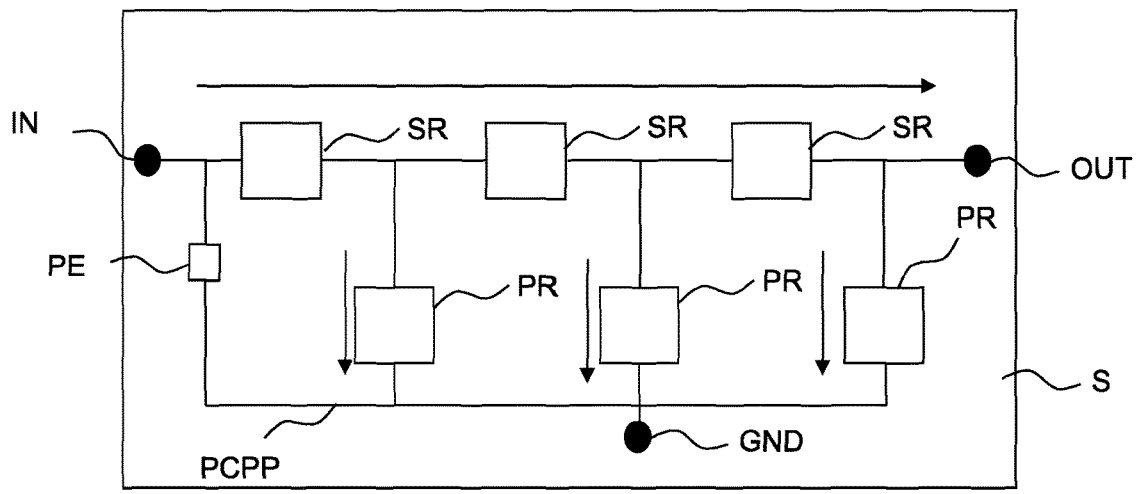
Figure 4:
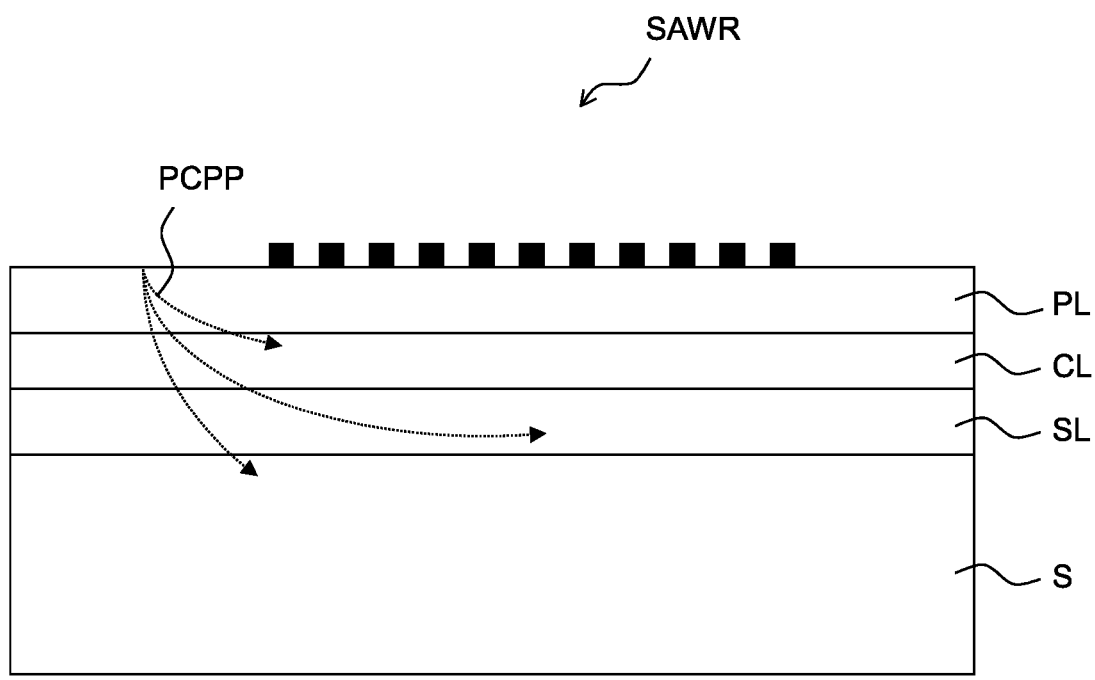
Figure 5:
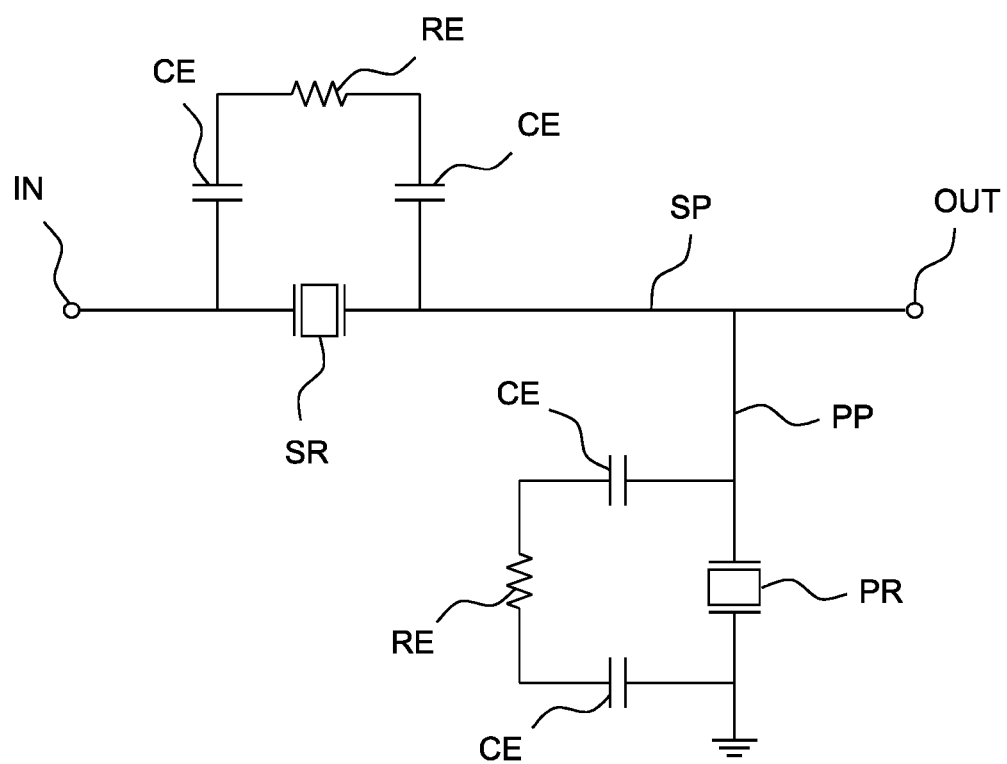
Figure 6:
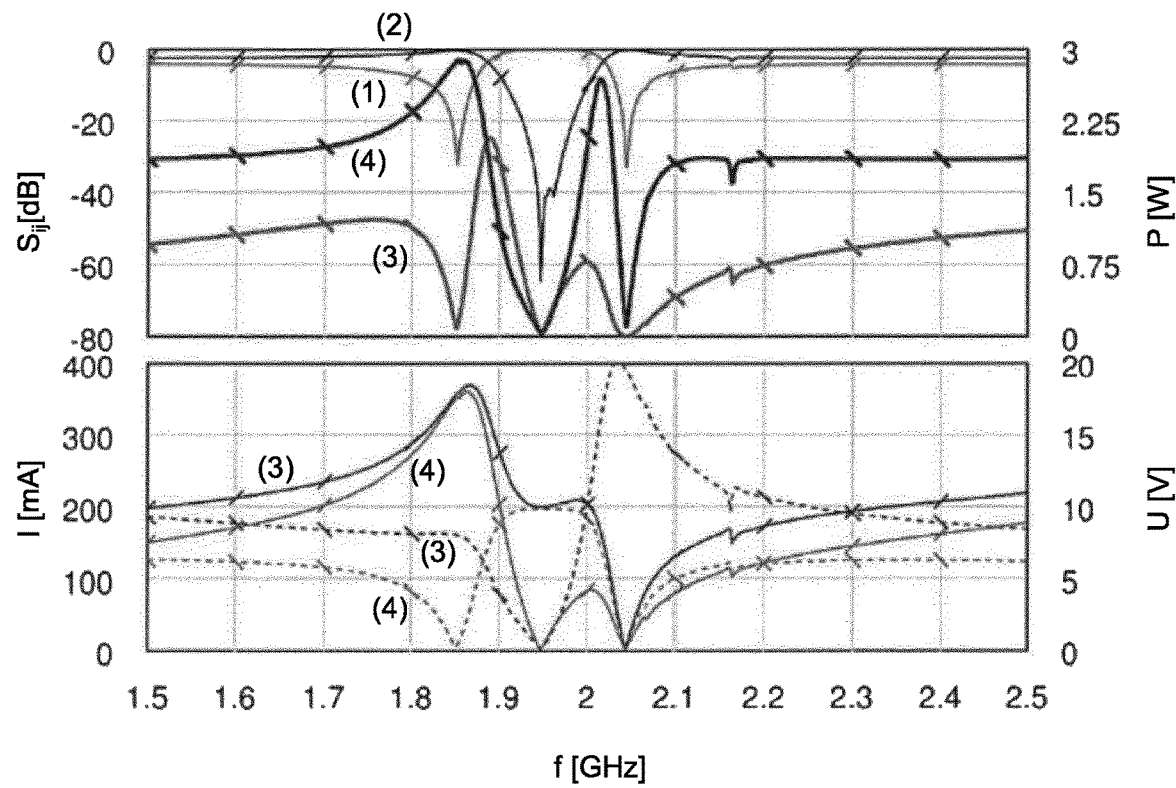
Figure 7:
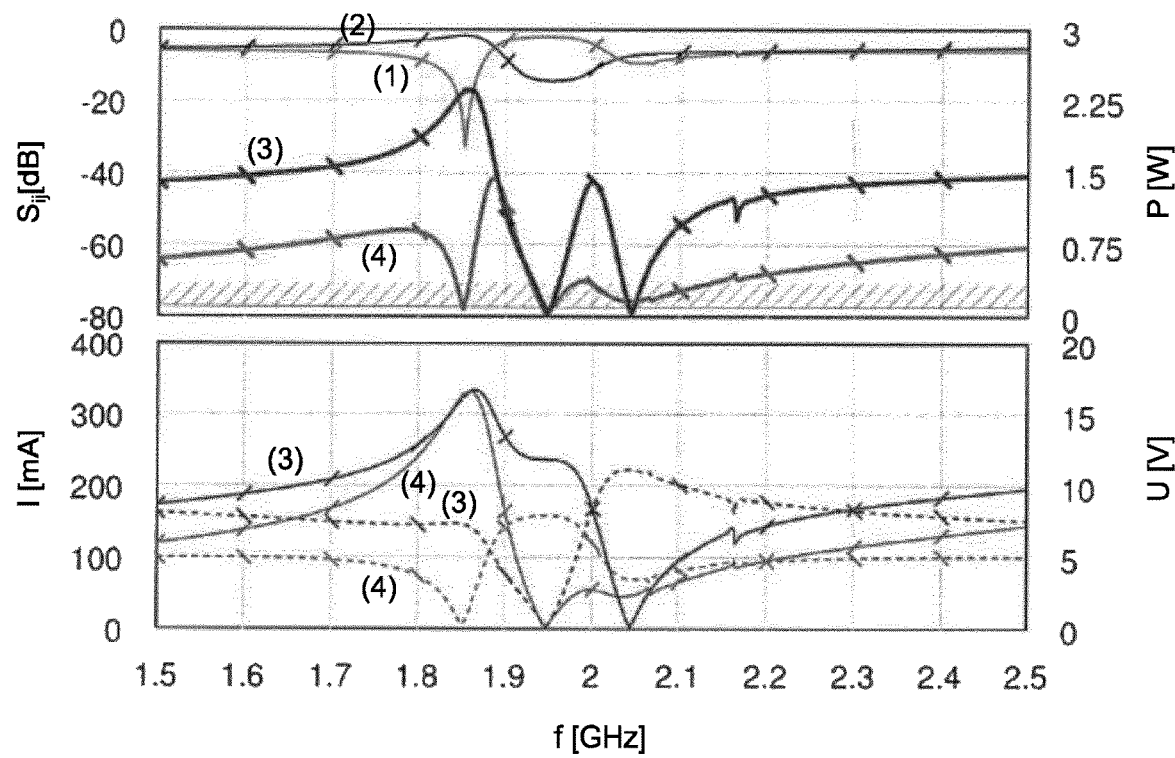
Figure 8:
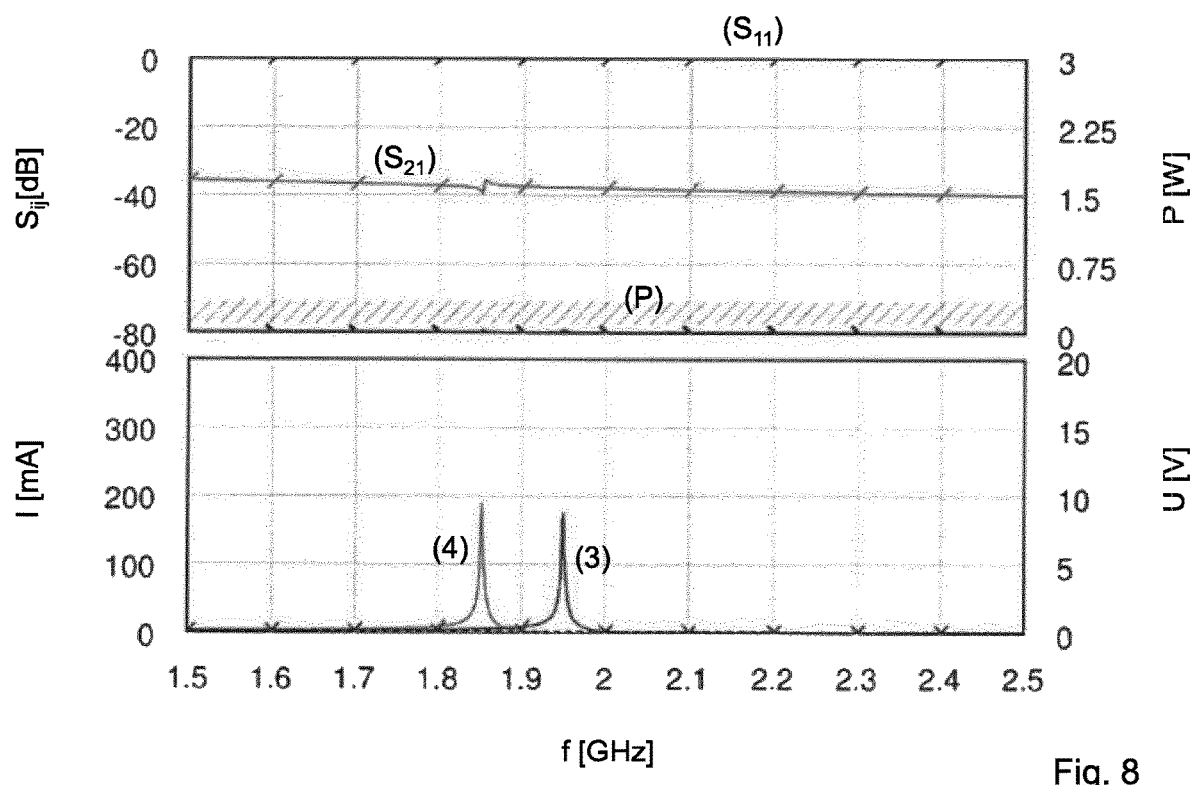
Figure 9:
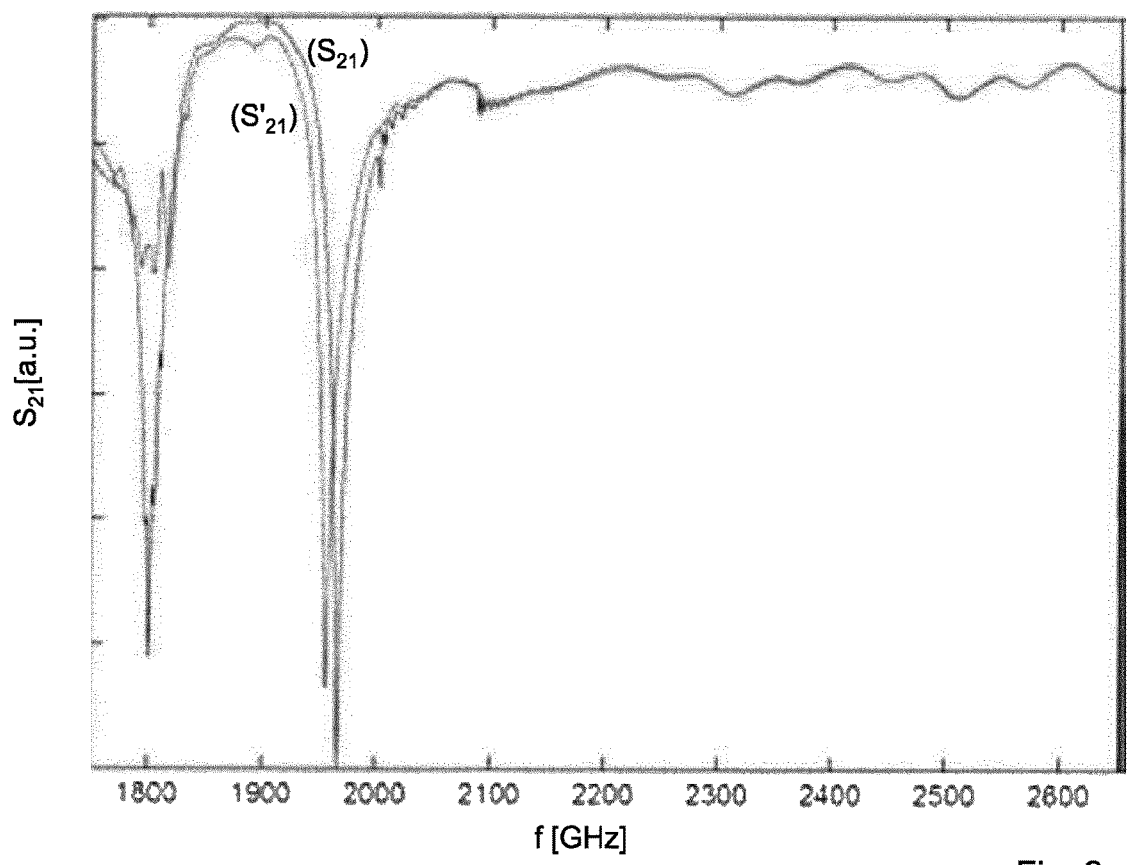
Figure 10:
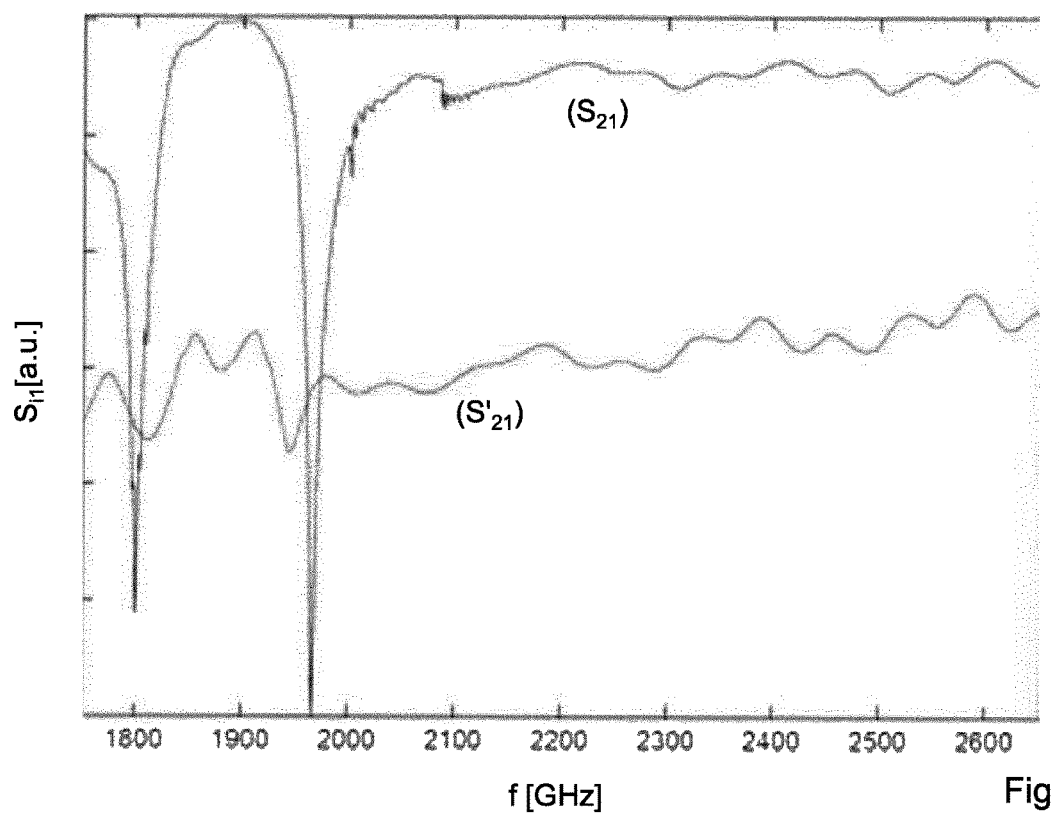
Figure 11:
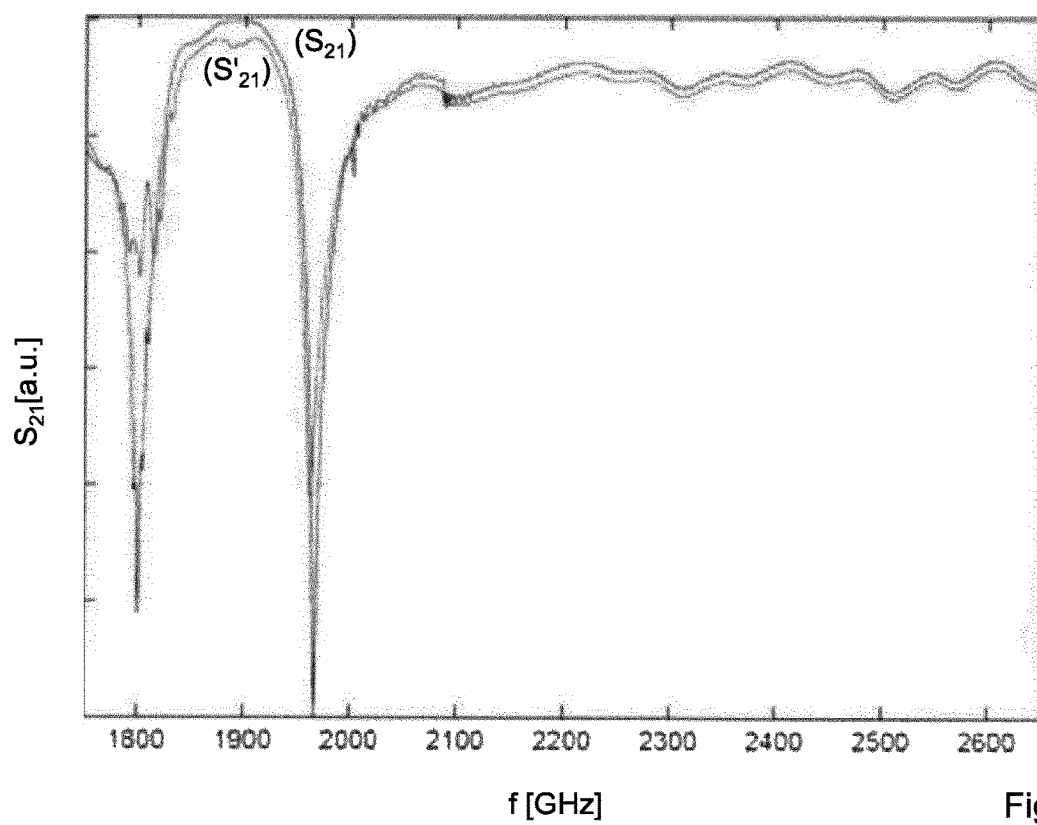

In the figures:

FIG. 1 shows the basic principle of the shunt path;
FIG. 2 illustrates an implementation in an RF filter;
FIG. 3 illustrates the possibility of a dedicated protection element;
FIG. 4 shows possible and preferred paths for the shunt path;
FIG. 5 illustrates an equivalent circuit diagram of a basic element of a ladder-type like configuration.
FIGS. 6 to 8 illustrate electric properties of the basic structure shown in FIG. 5 for different temperature and thus conductivity configurations;
FIGS. 9 to 11 illustrate the reversible effects of a temperature increase.

FIG. 1 shows a basic possibility of utilizing a tailored conductivity of material below the electrode structures to protect the electrode structures from permanent damage. The SAW resonator SAWR comprises electrode structures ES such as electrode fingers EF shown in sagittal plane of the corresponding component. The electrode structures ES are arranged on a piezoelectric material PM contained in a piezoelectric layer PL. The piezoelectric material PM is arranged on a carrier substrate S. The shunt path follows a parallel conduction protection path PCPP from an electrode element before the electrode structures ES to a location after the electrode structures ES. Thus, an excess of RF power can be shunted to protect the sensitive structures of the resonator.

FIG. 2 illustrates in a top view perspective a ladder-type like configuration of an RF filter. Between an input port IN and an output port OUT three series resonators SR are electrically connected in series. Further, three parallel paths, each comprising a parallel resonator PR, electrically connect the signal path to ground. The parallel conductance protection path PCPP establishes the possibility to conduct an excess of RF power at higher temperatures from the input port IN directly to the ground potential such that no permanent damage is done to the resonators.

FIG. 3 illustrates the possibility of providing a dedicated protection element PE integrated in the parallel conductance protection path PCPP. The protection element has a specific temperature dependent conductance characteristic. The protection element can be provided as arranged on the piezoelectric material, arranged above the piezoelectric material or embedded below the surface of the piezoelectric material.

FIG. 4 illustrates a preferred embodiment where a shunt layer SL is provided between the carrier substrate S and the piezoelectric layer PL. The shunt layer has a thickness and a temperature dependent conductivity such that the characteristic desired conductance is obtained.

Optionally the resonator has a compensation layer CL. The compensation layer can be arranged between the carrier substrate S and the piezoelectric layer PL. In particular, it is possible that the compensation layer CL is arranged between the shunt layer SL and the piezoelectric layer PL. However, it is also possible that the compensation layer CL is arranged between the carrier substrate S and the shunt layer SL.

Due to finite resistivity of the piezoelectric material, of the material of the compensation layer and the material of the carrier substrate corresponding further parallel partial shunt paths may also exist. However, it is possible that a special dedicated shunt path is provided which carries most of the excess of RF power, e.g. 90% or more of the excess of RF power that should be led around the sensitive structures.

FIG. 5 illustrates an equivalent circuit diagram of a basic element of a ladder-type like configuration. In the signal path between the input port IN and the output port OUT in the basic element one series resonator SR is connected. Further, one parallel resonator PR is connected in a parallel path electrically connecting the signal path SP to ground. The environment of the corresponding resonator is modelled by a series configuration comprising a capacitive element CE, a resistive element RE and a further capacitive element CE. The series configuration is electrically connected parallel to the series resonator and to the parallel resonator, respectively.

The equivalent circuit diagram shown in FIG. 5 is the basis for the considerations with respect to FIGS. 6 to 11.

In FIG. 6 matrix elements $S_{ij}$ (transmission: $S_{21}$ and reflection: $S_{11}$) and corresponding values for power, current and voltage are shown. In particular, curve 1 illustrates the insertion loss ($S_{21}$). Curve 2 illustrates the reflectivity ($S_{11}$) Curves 3 and 4 represent the power losses P where curve 3 represents the power losses in the series resonator and curve 4 represents the power losses in the parallel resonator.

In the lower part of FIG. 6 corresponding value for current (solid lines) and voltage (dashed lines) are provided. Curves 3 represent the series resonator and curves 4 represent the parallel resonator. The characteristics shown in FIG. 6 represent a configuration of the low conductivity of the shunt path represented by the resistive element and the capacitive elements in FIG. 5. Thus, FIG. 6 illustrates a mode of normal operation and normal operation temperatures.

In contrast, FIG. 7 illustrates the corresponding curves for an increased temperature resulting in an increased conductivity of the shunt paths around each resonator. It is clearly visible that the dissipated power is significantly reduced.

Furthermore, FIG. 8 illustrates the characteristics at a high temperature scenario where the conductivity is high. Dissipated power is mainly zero and the reflection coefficient mainly equals 100%.

FIG. 9 illustrates the insertion loss in an unloaded circuit configuration ($S_{21}$) and in a loaded circuit configuration ($S'_{21}$) for a normal operation temperature.

In contrast, FIG. 10 illustrates the same situation for an increased temperature due to self-heating of the resonator clearly shown by the substantially increased insertion loss for the loaded circuit configuration $S'_{21}$.

Furthermore, FIG. 11 illustrates the insertion losses after the resonators have cooled down. The initial filter characteristics shown in FIG. 9 have been nearly restored. Permanent damage has been prevented.

The SAW resonator and the RF filter are not limited to the details explained above and shown in the figures. The resonator can comprise further elements. In particular the electrode structure can comprise a multilayer construction that helps shape the main acoustic mode and that helps to suppress unwanted acoustic modes. The RF filter can comprise further circuit elements such as further filter stages and in particular a cascading of resonators is possible to further reduce the stress on the resonators.

LIST OF REFERENCE SIGNS

CE: capacitive element
CL: (temperature) compensation layer
EF: electrode finger
ES: electrode structure
GND: ground potential
IN: input port
OUT: output port
PCPP: shunt path, parallel conductance protection path
PE: protection element
PL: piezoelectric layer
PM: piezoelectric material
PP: parallel path
PR: parallel resonator
RE: resistive element
S: carrier substrate
SAWR: SAW resonator
SL: shunt layer
SP: signal path
SR: series resonator

The invention claimed is:

1. A surface acoustic wave (SAW) resonator, comprising:
a carrier substrate, an electrode structure, and a piezoelectric material arranged between the carrier substrate and the electrode structure; and
a shunt path arranged and configured to have a temperature dependent conductance that enables a radio frequency (RF) signal at an input of the electrode structure to bypass the electrode structure depending on a temperature of the shunt path.

2. The SAW resonator of claim 1, further comprising reflection structures between which the electrode structure is arranged.

3. The SAW resonator of claim 1, wherein the piezoelectric material is contained in a piezoelectric layer and the SAW resonator is a thin film SAW (TF-SAW) resonator.

4. The SAW resonator of claim 1, further comprising a protection element, wherein the protection element establishes an element of the shunt path.

5. The SAW resonator of claim 1, wherein the carrier substrate comprises silicon.

6. The SAW resonator of claim 1, wherein the temperature dependence conductance of the shunt path is based on a doping.

7. The SAW resonator of claim 1, further comprising a compensation layer between the carrier substrate and the piezoelectric material.

8. The SAW resonator of claim 7, wherein the compensation layer comprises a silicon oxide, a doped silicon oxide, silicon dioxide, or doped silicon dioxide.

9. The SAW resonator of claim 1, further comprising:
a shunt layer between the carrier substrate and the piezoelectric material, wherein the piezoelectric material is in a piezoelectric layer; and
a compensation layer between the shunt layer and the piezoelectric layer, wherein:
the carrier substrate comprises silicon,
the shunt layer comprises polycrystalline silicon and has a thickness between $0.01\lambda$, and $1.0\lambda$,
the compensation layer comprises a silicon oxide and has a thickness between $0.01\lambda$, and $1.0\lambda$,
the piezoelectric layer comprises lithium tantalate and has a thickness between $0.01\lambda$, and $1.0\lambda$,
the electrode structure comprises Al as its main constituent and has a thickness between $0.02\lambda$, and $0.2\lambda$, and
$\lambda$, is the acoustic wavelength of the SAW resonator's main mode.

10. The SAW resonator of claim 9, wherein the carrier substrate is oriented such that Euler angles are ($0°\pm10°$, $0°\pm10°$, $45°\pm10°$) or ($45°\pm10°$, $54°\pm10°$, $0°\pm$) $10°$ with respect to the acoustic propagation direction of the SAW resonator's main mode.

11. An RF filter comprising the SAW resonator of claim 1.

12. The SAW resonator of claim 1, further comprising a shunt layer between the carrier substrate and the piezoelectric material, the shunt layer forming at least a portion of the shunt path.

13. The SAW resonator of claim 12, wherein the shunt layer comprises polycrystalline silicon.

14. The SAW resonator of claim 12, wherein the piezoelectric material is in a piezoelectric layer, and wherein the SAW resonator further comprises a compensation layer between the shunt layer and the piezoelectric layer.

15. A surface acoustic wave (SAW) resonator, comprising:
a carrier substrate, an electrode structure, and a piezoelectric material arranged between the carrier substrate and the electrode structure;
a shunt path parallel to the electrode structure and provided to enable a radio frequency (RF) signal to bypass the electrode structure, wherein the shunt path has a temperature dependent conductance; and
a shunt layer between the carrier substrate and the piezoelectric material.

16. The SAW resonator of claim 15, wherein the shunt layer comprises polycrystalline silicon.

17. The SAW resonator of claim 16, wherein the shunt layer has:
a conductivity below $10^{-3}$ $1/\Omega cm$ at temperatures below $100°$ C.; and
a conductivity above $10^{-3}$ $1/\Omega cm$ at temperatures above $200°$ C.

18. The SAW resonator of claim 15, wherein the piezoelectric material is in a piezoelectric layer and wherein the SAW resonator further comprises a compensation layer between the shunt layer and the piezoelectric layer.

19. The SAW resonator of claim 15, wherein the shunt layer forms at least a portion of the shunt path.

20. The SAW resonator of claim 15, wherein the temperature dependent conductance of the shunt path is based at least in part on a doping in the shunt layer.

* * * * *